United States Patent [19]

Peacey et al.

[11] 4,281,290

[45] Jul. 28, 1981

[54] VOLTAGE MONITOR

[75] Inventors: John G. Peacey, Pointe Claire, Canada; Ralph R. Ebersole, Sikeston, Mo.; Frank Kitzinger, Montreal; Jean-Claude Viens, Dollard-des-Ormeaux, both of Canada

[73] Assignee: Noranda Mines Limited, Toronto, Canada

[21] Appl. No.: 15,593

[22] Filed: Feb. 27, 1979

[51] Int. Cl.³ .............................................. G01N 27/42
[52] U.S. Cl. ..................................... 324/426; 324/133; 340/870.29
[58] Field of Search ...................... 324/99 D, 127, 133, 324/132, 428, 435; 340/206, 201 P

[56] References Cited

U.S. PATENT DOCUMENTS

| 3,157,870 | 11/1964 | Marino et al. | 324/435 |
| 3,366,943 | 1/1968 | Hart | 324/132 |
| 3,515,983 | 6/1970 | Lante | 324/428 |
| 3,943,498 | 3/1976 | McClelland | 340/201 P |
| 4,163,935 | 8/1979 | Sakurada | 324/133 |

Primary Examiner—Michael J. Tokar
Attorney, Agent, or Firm—Fleit & Jacobson

[57] ABSTRACT

A voltage monitor is disclosed. The voltage monitor comprises a digital voltmeter for displaying a measured input voltage, and means for converting the varying input voltage of the monitor into a stabilized power supply voltage for the operation of the digital voltmeter. The input voltage is applied to the digital voltmeter through a response time controller providing a long time constant averaging value of input voltage to the digital voltmeter when the input voltage is within a predetermined range about a normal value, and for providing a faster response to input voltage values when the input voltage exceeds its normal value. The voltage is also applied to a stability indicator through an averaging circuit which permits the stability indicator to show short term fluctuations of input voltage about its normal value.

9 Claims, 4 Drawing Figures

VOLTAGE MONITOR

This invention relates to a voltage monitor and, more particularly, to an apparatus using a digital voltmeter for monitoring electrolytic cells in the aluminum industry.

BACKGROUND OF THE INVENTION

As commonly known, aluminum production consumes a large amount of electrical energy. In a typical aluminum refinery, every cell can be controlled individually by the operator. The cell voltage is displayed on an analog voltmeter which has an operating range of 0–8 volts. There is a known cell voltage at which the cells should be maintained to ensure efficient cell operation. In practice, the operator reads the cell voltage from the analog meter and makes a manual adjustment if necessary. Considering the rapidly increasing cost of electrical energy, this system needs refinement. The following is a list of the main disadvantages of the present analog voltmeter system:

(1) Read-out accuracy of the present analog voltmeters is not better than ±100 millivolts.

(2) The electro-mechanical voltmeter movement is sensitive to shock and vibration.

(3) The voltmeter is using magnetic field to deflect the pointer; therefore auxiliary magnetic fields adversely affect the accuracy of such voltmeters.

(4) The small amount of hydrogen fluoride present in aluminum refineries attacks the front glass of the voltmeter and this further reduces the read-out accuracy.

SUMMARY OF THE INVENTION

It is therefore the object of the present invention to overcome the disadvantages of using analog voltmeters by replacing the analog voltmeters by digital voltmeters permitting closer control of aluminum cell parameters.

It is a further object of the present invention to provide a voltage monitor using a digital voltmeter which derives its own operating voltage from the measured voltage.

It is a further object of the present invention to provide a cell voltage monitor which gives a better indication of the cell operating stability.

The voltage monitor, in accordance with the invention, comprises a digital voltmeter for displaying a measured input voltage, means for converting the varying input voltage of the monitor into a stabilized power supply voltage for the operation of the digital voltmeter, and a response time controller for applying the input voltage to the digital voltmeter, the response time controller providing a long time constant averaging value of input voltage to the digital voltmeter when the input voltage is within a predetermined range about a normal value, but providing a faster response to the input voltage output when the cell voltage largely exceeds its normal value. Such response time controller preferably includes a R-C circuit, a voltage comparator for comparing the input voltage to a reference value, a light emitting diode connected to the output of the voltage comparator and a photo resistor forming part of such R-C circuit and responsive to energization of the light emitting diode for lowering the time constant of the R-C circuit.

In a preferred embodiment of the invention, the input voltage is also applied to a stability indicator through an averaging circuit which permits the stability indicator to show short term fluctuations of input voltage about its normal operating value. Such a stability indicator preferably comprises at least one voltage comparator connected to the input voltage and to the output of the averaging circuit for comparing the output of the averaging circuit with that of the input voltage, means for biasing the comparator so that it will provide an output only when the fluctuations in the input voltage exceeds the setting of such biasing means. Most preferably, a plurality of voltage comparators each provided with a separate light emitting diode and a separate biasing means of increasing value are provided so that they will conduct in sequence as the fluctuations in input voltage increase above the setting of the different biasing means.

The means for converting the varying input voltage of the monitor into a stabilized power supply voltage for the operation of the digital voltmeter preferably includes a transistor circuit including a biasing zener diode adapted to limit the output voltage of the power supply to a predetermined value when the input voltage rises above its normal value and providing an output voltage substantially equal to the input voltage when the input voltage is below such predetermined value. The power supply further comprises a multivibrator connected to the output of such transistor circuit and a voltage regulator connected to the output of the multivibrator for providing an output voltage corresponding to the inverse value of the output of the transistor circuit so as to provide the required inverse voltage supply to the digital voltmeter. Such an arrangement is very valuable since there is no need for providing a separate supply for operation of the monitor which supply may be inconvenient or difficult to provide in particular locations.

BRIEF DESCRIPTION OF THE DRAWINGS

The invention will now be disclosed, by way of example, with reference to the accompanying drawings in which.

DESCRIPTION OF A PREFERRED EMBODIMENT OF THE INVENTION

Figure 1:
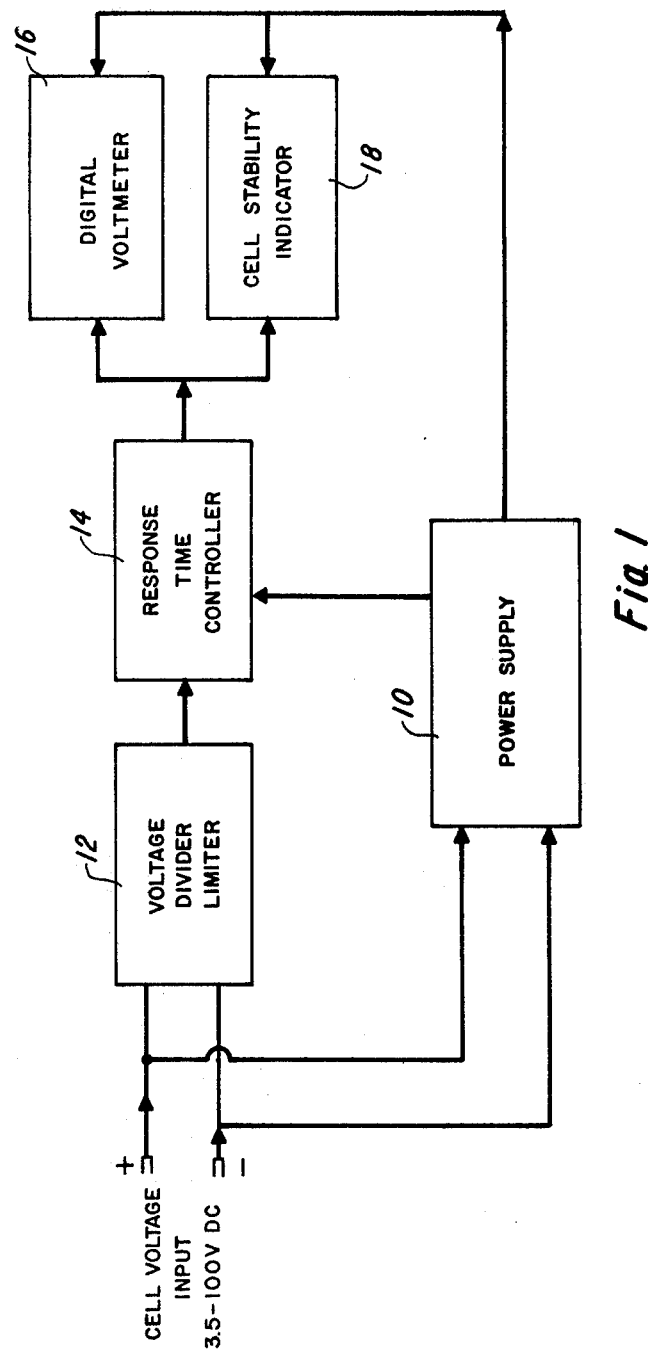
FIG. 1 illustrates a block diagram of a voltage monitor used for monitoring aluminum cells.

FIG. 1 shows a block diagram of an embodiment of a voltage monitor used for monitoring aluminum cells. The cell voltage is typically 4.5 volts DC and normally fluctuates by about ±200 millivolts from that voltage value, but may rise up to 100 volts during a so-called "anode effect" which is a well known phenomena occurring in electrolytic cells used in the aluminum industry. The cell voltage detected by the monitor is applied to a power supply 10 which is designed to convert this variable DC voltage to a stabilized ±5 V supply for the digital voltmeter and various sections of the cell monitor. The cell voltage is also applied to a voltage divider limiter 12 which divides the cell voltage by a predetermined factor depending on the scale of the digital voltmeter and also provides over-voltage protection for the various components of the monitor in case of cell voltage increases to abnormally high values.

The output voltage of the voltage divider limiter is fed to a response time controller 14 which is itself connected to a digital voltmeter 16 and a cell stability indicator 18. The function of the response time controller is to provide a slow response averaging value of cell voltage when the cell voltage is operating normally. This way, small fluctuations of the cell voltage are disregarded and the digital voltmeter displays an accurate mean value. During an "anode effect" when the cell voltage increases above, say 5 volts, the response time controller switches to fast response and the digital voltmeter will display the varying voltage up to the maximum reading of the voltmeter in order to alert the operator of the upset condition. Above this value, the voltmeter will register overscale.

Figure 2:
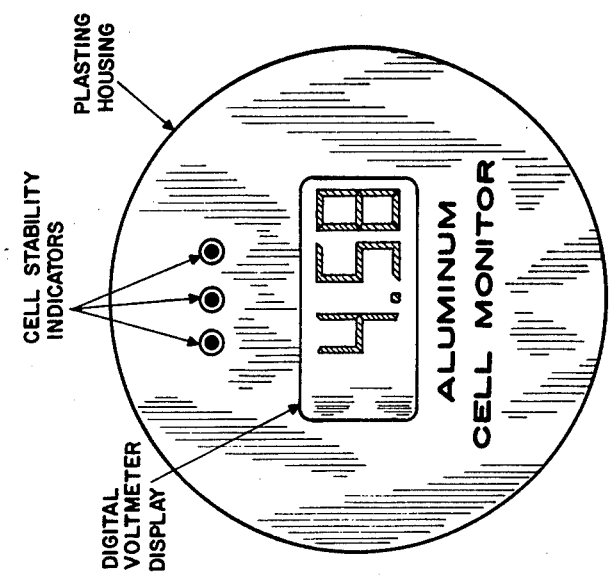
FIG. 2 illustrates the front view of an aluminum cell monitor housing enclosing the components of the monitor.

The digital voltmeter 16 simply displays the measured cell voltage while the function of the cell stability indicator is to show short time fluctuations in cell voltage by turning on, one by one, cell stability indicator lights, as shown in FIG. 2 of the drawings, which serve as pilot lights. A normally operating aluminum cell exhibits a small cell voltage fluctuation (in the range of 0–50 mV), and under this condition, all the indicator lights will be off. When the aluminum cell becomes less stable, indicating less efficient cell operation, the cell voltage fluctuations may increase up to several tenths of a volt. The indicator lights will then progressively come on to show increasing degrees of voltage instability. The sensitivity of the cell stability indicator is preferably set to indicate an increasingly unstable cell condition.

Figure 3:
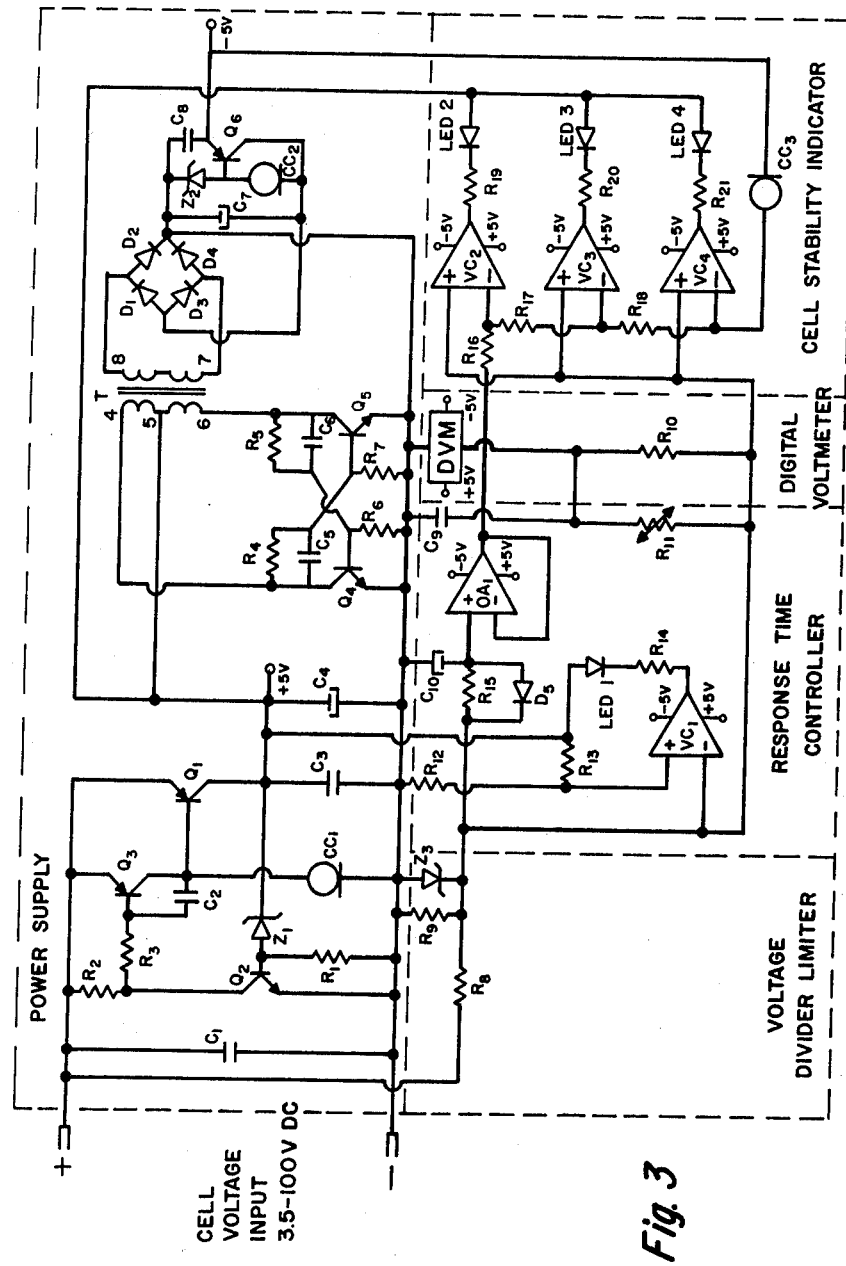
FIG. 3 illustrates the circuit diagram of the aluminum cell monitor.

FIG. 3 shows a detailed electronic circuit diagram of an embodiment of the cell monitor. The cell voltage detected by the monitor is converted by the power supply section of the monitor to a stabilized ±5 volts supply. The cell voltage causes a current to flow through a transistor Q1 which is biased by a constant current diode CC1 connected between the base of Q1 and the common junction of the power supply. The collector current of Q1 passes through a zener diode Z1 to bias a transistor Q2 through a resistor R1 which is connected between the base of transistor Q2 and the common junction of the power supply. In turn, the collector current of Q2 will bias a transistor Q3 through resistors R2 and R3. The output voltage of the above disclosed circuit is thus controlled by zener diode Z1; when the cell voltage is above 5 volts, the output of the circuit is stabilized by zener diode Z1 to +5 V and if it falls below 5 volts, the output voltage will be very close to the cell voltage. The circuitry is relatively insensitive to voltage variations between 3.5 and 5 volts. The function of capacitor C1 connected across the input terminals of the monitor, capacitor C2 connected between the base and collector electrodes of transistor Q3 and capacitor C3 connected between the collector electrode and the common junction of the power supply is to prevent oscillation of the power supply. Capacitor C4 which is connected across the output of the +5 V terminals of the power supply is to filter the noise components generated in the power supply.

The remaining section of the power supply is to produce −5 V. Transistors Q4 and Q5 form a conventional multivibrator with resistors R4 to R7, capacitors C5 and C6 and the primary winding of a transformer T. This multivibrator operates in the audio frequency range and produces a square wave output at the secondary of transformer T. A full wave bridge rectifying circuit including diodes D1–D4 is connected to the secondary winding of transformer T to rectify this square wave, and a capacitor C7 is connected across opposite arms of such bridge to filter the output in known manner. Constant current diode CC2 and zener diode Z2 connected across the output of the bridge circuit provide a 5 volt reference voltage to a voltage follower transistor Q6 having is base connected to the junction of the constant current diode CC2 and the zener diode Z2. The output of Q6 is the regulated −5 volt power supply. Capacitor C8 connected between the junction of diodes D2 and D4 and the emitter of Q6 serves as a filter capacitor.

The voltage divider limiter 12 comprises resistors R8 and R9 the values of which are selected to divide the in-coming cell voltage by a factor of 10 for a reason to be disclosed later. A zener diode Z3 is connected across resistor R9 to limit the DC voltage to about 5 volts for preventing damage to the response time controller and to the digital voltmeter.

The output of the voltage divider limiter is applied to the digital voltmeter through a response time controller including resistors R10 and R11 which are connected in parallel. A capacitor C9 is connected across the digital voltmeter and forms with resistors R10 and R11 a R-C circuit. R10 has a high resistance value and R11 is a photo-resistor which also has a very high resistance when not illuminated. The above RC circuit thus normally has a long time constant which renders the digital voltmeter insensitive to small fluctuations in cell voltage above the normal operating value so that the digital voltmeter may be easily read by the operator. The response time controller also includes a voltage comparator VC1 having its inverting input terminal connected to the output of the voltage divider limiter 12 and its non-inverting terminal connected to the junction of a voltage divider including resistors R12 and R13 connected across the stabilized +5 V power supply. The ratio of resistors R12 and R13 is such as to provide about 500 millivolts to the non-inverting terminal of VC1. Thus, when the cell voltage rises above 5 volts producing more than 500 millivolts to the inverting input of VC1 due to the relative values of R8 and R9 of the voltage divider limiter, a current starts to flow through resistors R14 and light emitting diode LED 1. The light originating from the light emitting diode falls on photo resistor R11 to decrease its resistance to a low value. This lowers the time constant of the RC circuit and permits the digital voltmeter to closely follow the variations in cell voltage.

The digital voltmeter used in the present embodiment is a conventional $3\frac{1}{2}$ digit voltmeter having an operating range of 0–1.999 V. Since the cell voltage is divided by 10, the actual measurement range of the digital voltmeter becomes 0–19.99 V. Of course, the operating range of the digital voltmeter could be different and the voltage divider R8–R9 would have to be modified accordingly.

Figure 4:
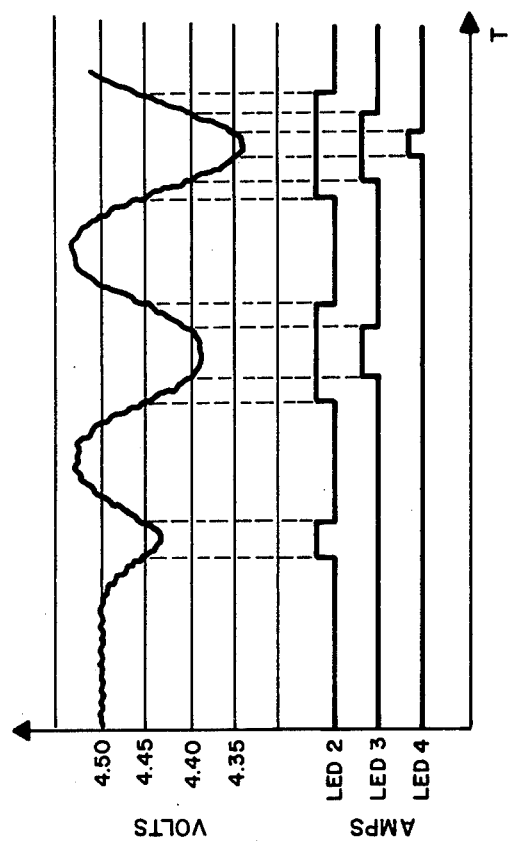
FIG. 4 illustrates a voltage diagram for the purpose of illustrating the operation of the cell stability indicator.

The output of the voltage divider limiter is also applied to the non-inverting terminals of three voltage comparators VC2, VC3 and VC4 forming part of the cell stability indicator 18. The output of the voltage divider limiter is further applied to the inverting terminal VC2, VC3 and VC4 through a R-C circuit including resistor R15 and capacitor C10 and through an operational amplifier OA1 acting as a voltage follower. Resistor R15 has a high resistance value so that the R-C circuit has a long time constant which averages the voltage applied to the inverting terminal of the voltage comparators VC2, VC3 and VC4 and thus renders such inverting inputs non sensitive to small fluctuations in cell voltage about the normal operating value. The voltage comparators VC2, VC3 and VC4 are biased from the −5 V power supply through constant current diode CC3 and resistors R17 and R18 so that they will start to conduct in a consecutive order as the voltage fluctuations go up by a predetermined increamental value, i.e. 50 millivolts. Thus, the voltage comparators VC2, VC3 and VC4 compare the cell voltage before and after averaging through the RC circuit formed by resistor R15 and capacitor C10. When the cell voltage is steady, the voltages before and after averaging will be at the same level and the voltage comparators will be off. When the cell is in a less stable condition, the cell voltage will fluctuate up and down about the average value, as shown in FIG. 4 of the drawings. If this fluctuation is sufficiently great, it will overcome the offset caused by CC3 and R17 and R18 to turn on voltage comparator VC2. In turn, current will flow through resistor R19 and light emitting diode LED 2. The light emitting diode serves as a pilot light to warm the operator. Similarly, a greater upset will turn on comparator VC3 and energize light emitting diodes LED 3 through resistor R20. A still greater upset will turn on comparator VC4 and energize light emitting diode LED 4 connected to VC4 through resistor R21.

In case of an "anode effect" condition, the voltage appearing at the output of the R-C circuit formed by resistor R15 and capacitor C10 will rise up to the break down voltage of zener diode Z3, that is 5 volts. This will not affect the operation of the cell stability indicator since both the inverting and non-inverting inputs of the voltage comparators VC2, VC3 and VC4 will be at the same potential. However, when the "anode effect" condition is over, the cell voltage will return to its normal operating voltage almost instantaneously, that is about 4.5 volts. Due to the long time constant of resistors R15 and capacitors C10, the voltage appearing at the inverting terminals of voltage comparators VC2, VC3 and VC4 will be slowly returning to 4.5 volts and the lights LD2, LD3 and LD4 will be energized by the voltage comparators giving a wrong indication of cell instability. To prevent this situation, a reverse biased diode D5 is connected across resistor R15 of the R-C circuit to rapidly discharge capacitor C10.

The above disclosed cell voltage monitor has the following advantages over the previously used analog voltmeter system:

(1) Read-out accuracy is ±10 millivolts. This represents a 10-fold improvement over the conventional analog voltmeter system.

(2) The solid state circuitry employed in the aluminum cell monitor in accordance with the invention is insensitive to shock and vibration.

(3) Magnetic fields have no effect on the operation of the aluminum cell monitor in accordance with the invention.

(4) When the housing of the monitor is made of plastic, it is not affected by hydrogen fluoride. The read-out accuracy will not decrease because of fogging of the front surface.

(5) The large digits of the aluminum cell monitor are readable from 12 feet distance. This makes easier for the operator to notice abnormal operating conditions.

(6) The cell stability indicator provides early warning of a cell becoming unstable and so helps to prevent a "sick" cell and maintain higher cell operating efficiency.

Although the invention has been disclosed with reference to a preferred embodiment for monitoring aluminum cell voltage, it is to be understood that it may be used for measuring any output voltage. Various modifications may also be made to the above disclosed embodiment and the invention is not limited to such embodiment. For example, other types of response time controllers can be used. Other types of cell stability indicator could also be employed. The circuitry of the power supply could also be modified provided that it can provide a stabilized supply from the measured input voltage. Finally, the use of a voltage divider is not essential as such use depends on the operating range of the digital voltmeter and also on the maximum rating voltage of the operational amplifiers, transistors, diodes and other electronic components used in the cell voltage monitor.

The embodiments of the invention in which an exclusive property or privilege is claimed are defined as follows:

1. A voltage monitor comprising:
   (a) a digital voltmeter for displaying a measured input voltage;
   (b) means for converting the varying input voltage of the monitor into a stabilized power supply voltage for the operation of the digital voltmeter; and
   (c) response time controller means for applying said input voltage to said digital voltmeter, said response time controller means providing a long time constant averaging value of input voltage to the digital voltmeter when the input voltage is within a predetermined range about a normal value, and providing a faster response to input voltage values when the input voltage exceeds its normal value.

2. A voltage monitor as defined in claim 1, wherein said response time controller means includes an R-C circuit, a voltage comparator for comparing the input voltage to a reference value, a light emitting diode connected to the output of said voltage comparator, and a photo resistor forming part of said R-C circuit and responsive to energization of said light emitting diode for lowering the time constant of said R-C circuit.

3. A voltage monitor as defined in claim 2, wherein said input voltage is further applied to a stability indicator through an averaging circuit which permits the stability indicator to show short term fluctuations of input voltage about its normal value.

4. A voltage monitor as defined in claim 3, wherein said stability indicator comprises at least one voltage comparator connected to the input voltage and to the output of said averaging circuit for comparing the output of the averaging circuit with the input voltage, means for biasing said comparator so that it will provide an output only when the fluctuations in input voltage exceed the setting of said biasing means, and a light emitting diode connected to the output of said comparator and acting as a pilot light to warn an operator.

5. A voltage monitor as defined in claim 4, comprising a plurality of voltage comparators each provided with a separate light emitting diode and a separate biasing means of increasing value such that they will conduct in sequence as the fluctuations in input voltage increase above the setting of said biasing means.

6. A voltage monitor as defined in claim 1, further comprising a voltage divider limiter for dividing the input voltage by a predetermined factor and for providing an over-voltage protection in case the input voltage increases up above a predetermined level.

7. A voltage monitor as defined in claim 6, wherein said voltage divider limiter comprises two resistors connected across the input voltage for dividing the input voltage by a predetermined factor, and a zener diode connected across one of the resistors to produce an output voltage at said predetermined level.

8. A voltage monitor as defined in claim 1, wherein said means for converting the varying input voltage of the monitor into a stabilized power supply voltage for the operation of the digital voltmeter includes a transistor circuit including a biasing zener diode adapted to limit the output voltage of the power supply to a predetermined value when the input voltage is above its normal value and providing an output voltage substantially equal to the input voltage when the voltage is below said predetermined value.

9. A voltage monitor as defined in claim 8, further comprising a multivibrator connected to the output of said transistor circuit and a voltage regulator connected to the output of said multivibrator for providing an output voltage corresponding to the inverse value of the output of said transistor circuit.

* * * * *